US009170564B2

(12) United States Patent
Sato

(10) Patent No.: US 9,170,564 B2
(45) Date of Patent: Oct. 27, 2015

(54) TIME-TO-DIGITAL CONVERTER AND PLL CIRCUIT USING THE SAME

(71) Applicant: MegaChips Corporation, Osaka (JP)

(72) Inventor: Hideyuki Sato, Chiba (JP)

(73) Assignee: MegaChips Corporation, Osaka (JP)

( * ) Notice: Subject to any disclaimer, the term of this patent is extended or adjusted under 35 U.S.C. 154(b) by 0 days.

(21) Appl. No.: 14/554,737

(22) Filed: Nov. 26, 2014

(65) Prior Publication Data

US 2015/0145572 A1 May 28, 2015

(30) Foreign Application Priority Data

Nov. 28, 2013 (JP) .................................. 2013-245618
Jan. 22, 2014 (JP) ...................................... 2014-9395

(51) Int. Cl.
*H03L 7/06* (2006.01)
*G04F 10/00* (2006.01)
*H03L 7/099* (2006.01)
*H03L 7/093* (2006.01)
*H03L 7/08* (2006.01)

(52) U.S. Cl.
CPC ............ *G04F 10/005* (2013.01); *H03L 7/0802* (2013.01); *H03L 7/093* (2013.01); *H03L 7/0992* (2013.01)

(58) Field of Classification Search
USPC .................................. 327/147–149, 156–159
See application file for complete search history.

(56) References Cited

U.S. PATENT DOCUMENTS

| 8,564,471 | B1* | 10/2013 | Gao et al. ....................... 341/166 |
| 2003/0098731 | A1* | 5/2003 | Tabatabaei et al. ........... 327/160 |
| 2012/0001785 | A1* | 1/2012 | Nagata et al. .................. 341/152 |
| 2013/0043920 | A1* | 2/2013 | Lee et al. ....................... 327/159 |
| 2013/0147531 | A1* | 6/2013 | Lee et al. ....................... 327/158 |
| 2014/0091847 | A1* | 4/2014 | Schimper ....................... 327/287 |
| 2015/0116018 | A1* | 4/2015 | Chen et al. .................... 327/159 |
| 2015/0130544 | A1* | 5/2015 | Gao et al. ......................... 331/18 |
| 2015/0145572 | A1* | 5/2015 | Sato ............................. 327/159 |
| 2015/0155245 | A1* | 6/2015 | Li et al. .......................... 257/48 |

OTHER PUBLICATIONS

I. Nissinen, A. Mantyniemi, and J. Kostamovaara, "A CMOS time-to-digital converter based on a ring oscillator for a laser radar," IEEE ESSCIRC, pp. 469-472, Apr. 2003 (5 pages).

(Continued)

*Primary Examiner* — Adam Houston
(74) *Attorney, Agent, or Firm* — Osha Liang LLP

(57) ABSTRACT

A time-to-digital converter (TDC) that has high resolution, excellent linearity, and a widerange. The TDC includes a first oscillator unit that generates and outputs a pair of first oscillation signals based on a pair of predetermined clock signals that have a predetermined phase difference, a second oscillator unit that generates and outputs a second oscillation signal that have a predetermined frequency based on the pair of first oscillation signals outputted from the first oscillator unit, and a quantizer that calculates a quantized value based on a number of edges of the second oscillation signal outputted from the second oscillator unit.

17 Claims, 11 Drawing Sheets

(56) References Cited

OTHER PUBLICATIONS

C. Hsu, M. Z. Straayer, and M. Perrot, "A low-noise wide-BW 3.6-GHz digital fractional-N frequency synthesizer with a noise shaping time-to-digital converter and quantization noise cancellation," IEEE J. Solid-State Circuits, vol. 43, No. 12, pp. 2776-2786, Dec. 2008 (11 pages).

M. Lee and A. A. Abidi, "A 9b, 1.25ps Resolution Coarse-Fine Time-to-Digital Converter in 90nm CMOS that Amplifies a Time Residue," JSSC, vol. 43, No. 4, pp. 769-777, Apr. 2008 (10 pages).

\* cited by examiner

TIME-TO-DIGITAL CONVERTER AND PLL CIRCUIT USING THE SAME

FIELD OF THE INVENTION

The present invention generally relates to a time-to-digital converter and a phase-locked loop (PLL) circuit using the same.

BACKGROUND OF THE INVENTION

As miniaturization in recent large-scale-integration (LSI) manufacturing process advances and the voltage required in an LSI chip lowers, significant improvements, including decreasing chip area, increasing speed, and decreasing power consumption, have been achieved in the digital circuit field. Similar improvements, however, have not been achievable in the analog circuit field. Some factors preventing the advance in the analog circuit field include a decrease in transistor gain, an increase in characteristic variation, and an increase in leak current.

Therefore, in designing a 'mixed signal IC (LSI),' which is a combination of a digital circuit and an analog circuit, an approach is to minimize the use of analog circuits and/or 'replace analog circuits with digital circuits.'

For example, a PLL circuit is used in a variety of applications, such as a clock generation circuit and a frequency synthesizer, but a charge pump and a loop filter each formed of a pure analog circuit are primarily responsible for preventing reduction in the area of a chip. Therefore, to reduce the area of a mixed signal IC, an All Digital Phase Locked Loop (ADPLL) circuit that replaces a conventional PLL circuit with a digital circuit is used.

In such an ADPLL circuit, in which a digital loop filter (DLF) is used, a phase frequency detector and a charge pump used in a PLL circuit are replaced with a time-to-digital converter (TDC). Further, a voltage controlled oscillator (VCO) is replaced with a digitally controlled oscillator (DCO).

For example, a TDC using a free-running oscillator (FROSC) is configured to include inverters having a ring structure and is advantageous in that linearity is more readily ensured than that in a TDC using single delay lines (SDL) (I. Nissinen, A. Mantyniemi, and J. Kostamovaara. A CMOS time-to-digital converter based on a ring oscillator for a laser radar. IEEE ESSCIRC, pages 469-472, April 2003).

Further, in order to achieve high resolution, a TDC using a multipath gated-ring oscillator (MPGRO) has been proposed (C. Hsu, M. Z. Straayer, and M. Perrot, "A low-noise wide-BW 3.6-GHz digital $\Delta\Sigma$ fractional-N frequency synthesizer with a noise shaping time-to-digital converter and quantization noise cancellation," IEEE J. Solid-State Circuits, vol. 43, no. 12, pp. 2776-2786, December 2008). An MPGRO is configured to include a multipath that allows an input to each delay cell to be an output from an immediately preceding delay cell and an output from the delay cell upstream of the immediately preceding delay cell. Using the MPGRO allows noise-shaping-based improvement of adequate resolution. The noise shaping used herein is to drive quantization noise into a high-frequency region. Therefore, in such an ADPLL circuit, the combination of the noise shaping and the characteristics of a lowpass filter allows removal of phase noise in a loop bandwidth.

Further, it is possible to achieve high resolution of a TDC by using a time amplifier (TA) in a TDC (M. Lee and A. A. Abidi, "A 9b, 1.25 ps Resolution Coarse-Fine Time-to-Digital Converter in 90 nm CMOS that Amplifies a Time Residue", JSSC, vol. 43, no. 4, pp. 769-777, April, 2008). A TA is a circuit that amplifies a time difference between input signals, and then outputs the amplified time difference. For example, when a TA has a gain A, inputting an output from the TA to a TDC having a gate delay Tg achieves an effective resolution Tg/A.

SUMMARY OF THE INVENTION

An ADPLL circuit at present, however, cannot outperform and replace a conventional PLL circuit because a TDC has physical limits, including current consumption, resolution, and linearity.

Specifically, a free-running ring oscillator-TDC (FROSC-TDC) is advantageous in that linearity is readily ensured, but cannot expect improvement in resolution because of gate delay limits.

A multipath gated ring oscillator-TDC (MPGRO-TDC) shows excellent characteristics in terms of resolution, linearity, and widerange, but possesses problems including an increase in current consumption and difficulty in layout. That is, using an advanced process helps achieve low power consumption, but employing a multipath causes a variety of nodes in the GRO to maintain intermediate potential states. Further, since wiring lines are arranged in a complicated manner, inter-node coupling affects an input having the intermediate potential and may possibly cause malfunction of the count. Moreover, since employing a multipath increases an amount of current flowing through a power-ground path, an increase in current consumption is unavoidable.

Further, a time amplifier (TA) can contribute to improvement in effective resolution of a TDC, but it too has problems, including too narrow a range of an input time difference for practical use. That is, since the configuration of the TA described in M. Lee and A. A. Abidi, "A 9b, 1.25 ps Resolution Coarse-Fine Time-to-Digital Converter in 90 nm CMOS that Amplifies a Time Residue," JSSC, vol. 43, no. 4, pp. 769-777, April, 2008 uses an SR latch, amplification can be performed only when the input time difference is very small (about several tens of pico-seconds, for example).

Advantageously, one or more embodiments of the present invention provide a novel TDC that overcomes the variety of problems associated with a conventional TDC and reliably achieves high resolution, excellent linearity, and broad widerange.

More specifically, one or more embodiments of the present invention provide a TDC that simplifies layout design without using a multipath, suppresses an increase in gate delay associated with using no multipath based on amplification of an input time difference, improves resolution, and ensures linearity.

One or more embodiments of the invention relate to a time-to-digital converter configured to calculate and output a quantized value by way of repeatedly generating first oscillation signals, based on a pair of clock signals having a predetermined phase difference (time difference) therebetween, with the pulse width of the first oscillation signal being equal to the time difference, generating a second oscillation signal based on the repeatedly-generated first oscillation signals, and detecting edges of the second oscillation signal.

Further, one or more embodiments of the invention relate to a time-to-digital converter that may include a first oscillator unit that generates and outputs a pair of first oscillation signals based on a pair of predetermined clock signals having a predetermined phase difference therebetween, a second oscillator unit that generates and outputs a second oscillation signal having a predetermined frequency based on the pair of first oscillation signals outputted from the first oscillator unit, and a quantizer that calculates a quantized value based on the number of edges of the second oscillation signal outputted from the second oscillator unit.

The resultant time-to-digital converter excels in resolution, speed, and linearity and is suitable for digital design.

The first oscillator unit may include a pair of ring oscillators. The pair of ring oscillators may be configured to generate and output the pair of first oscillation signals based on the pair of predetermined clock signals.

Further, each of the pair of ring oscillators may be configured to generate, in a single cycle of the corresponding clock signal, the first oscillation signals having the predetermined number of edges corresponding to a predetermined coefficient.

The time-to-digital converter may further include a phase detector that outputs, based on the pair of first oscillation signals outputted from the first oscillator unit, a differential enable signal in accordance with the phase difference between the first oscillation signals. The second oscillator unit may be configured to generate and output the second oscillation signal in accordance with the enable signal outputted from the phase detector.

The second oscillator unit may be a gated ring oscillator that oscillates in accordance with the differential enable signal.

The gated ring oscillator may be configured by a plurality of differential inverters that oscillate in accordance with the differential enable signal.

Alternatively, the gated ring oscillator may be configured by a plurality of single-end inverters that oscillate in accordance with the differential enable signal.

The quantizer may include a divider that divides the calculated quantized value by the predetermined coefficient and outputs a code value that is a result of the division.

The first oscillator unit may include counters, each of which counts the number of edges in the first oscillation signal and causes the corresponding ring oscillator to stop outputting the first oscillation signal when the count reaches the number equal to the predetermined coefficient.

The counters may be configured to change the predetermined number.

One or more embodiments of the invention relate to a time-to-digital converter constituent which may include a plurality of time-to-digital converter modules, each of which is configured by the time-to-digital converter described above and a multiplexer that selectively switches an output from any of the plurality of time-to-digital converter modules to another. The multiplexer may perform the switching control under a predetermined condition either after a predetermined period elapses from a point in time when the time-to-digital converter starts operating or based on one of outputted code values.

One or more embodiments of the invention relate to a time-to-digital converter constituent that may include a first time-to-digital converter module configured by the time-to-digital converter described above and a second time-to-digital converter module having an input phase difference range wider than the input phase difference range of the first time-to-digital converter module. The second time-to-digital converter module may perform first quantization based on a pair of inputted predetermined clock signals, and the first time-to-digital converter module may perform second quantization based on a quantization error produced by the first quantization.

One or more embodiments of the invention relate to a PLL circuit that may include the time-to-digital converter described above, a digital loop filter that removes high-frequency noise components from a signal outputted from the time-to-digital converter, a digitally controlled oscillator that is controlled based on a signal outputted from the digital loop filter, and a frequency divider that divides a signal outputted from the digitally controlled oscillator by a predetermined division ratio and outputs the divided signal as a feedback signal to the time-to-digital converter.

Advantageously, a novel time-to-digital converter (TDC) that excels in resolution, linearity, and widerange is provided.

According to one or more embodiments of the invention, by using a gated ring oscillator (GRO) in the TDC, noise shaping allows the effective resolution to be improved. Further, the GRO may not necessarily be a multipath GRO, whereby the layout design can be readily performed with the linearity improved.

Moreover, using a non-multipath GRO inevitably increases the gate delay value, but according to one or more embodiments of the invention, as two clock signals having a time difference therebetween are repeatedly reproduced over a predetermined number of times, the input time difference is amplified and, therefore, an effective gate delay value can be reduced.

Other technical features, purposes, and advantageous effects or advantages of the present invention will be apparent in the following examples that are described with reference to the accompanied drawings.

DETAILED DESCRIPTION

In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention. Examples of the present invention will next be described with reference to the drawings.

FIRST EXAMPLE

Figure 1:
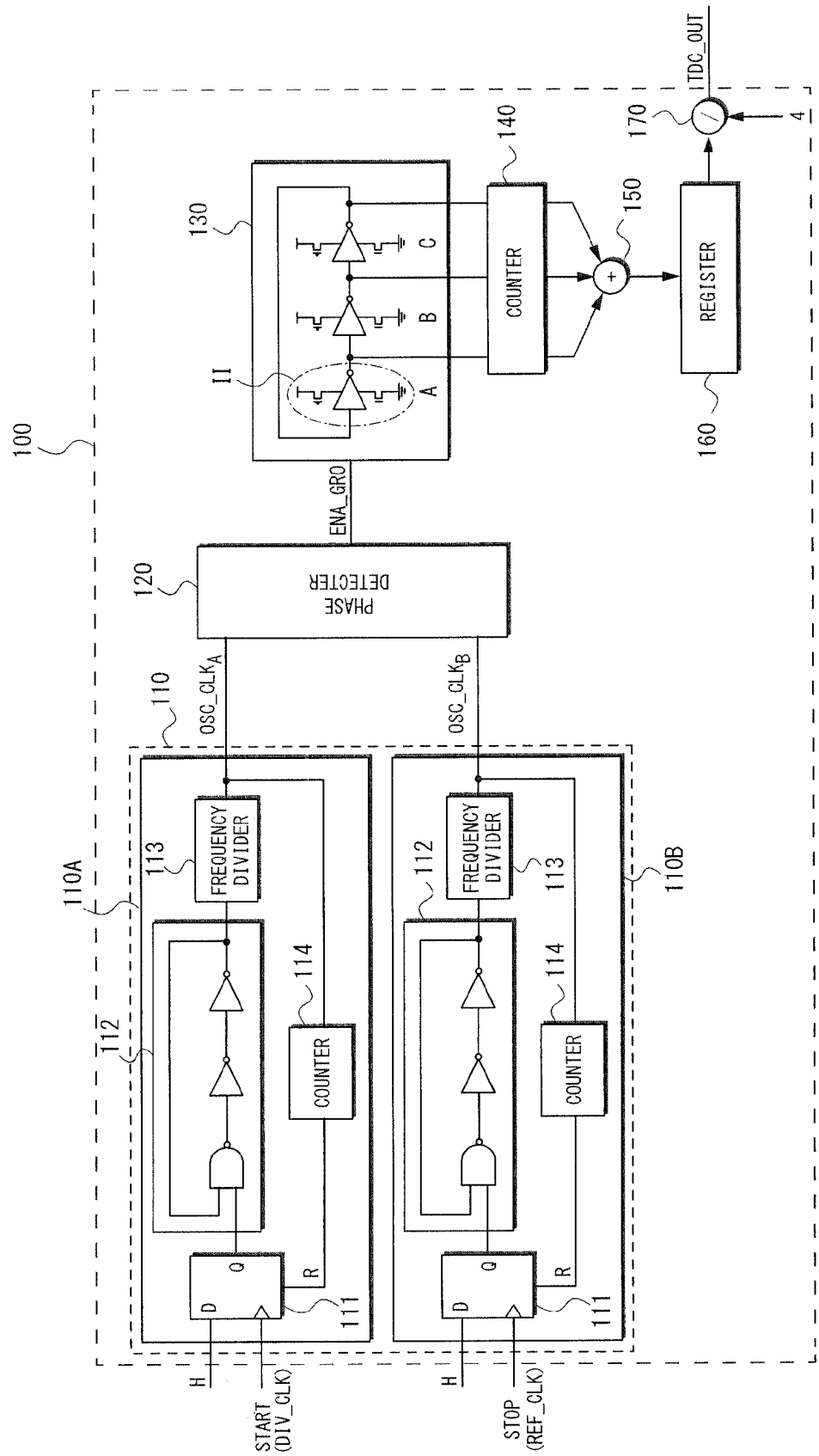
FIG. 1 is a block diagram showing an example of a configuration of a time-to-digital converter (TDC) according to one or more embodiments of the present invention.

FIG. 1 is a block diagram showing an example of a configuration of a time-to-digital converter (TDC) according to one or more embodiments of the present invention. As shown in FIG. 1, a time-to-digital converter (TDC) 100 may be configured to include a first oscillator unit 110, a phase detector 120, a second oscillator unit 130, a counter 140, an adder 150, a register 160, and a divider 170.

The first oscillator unit 110 may be a time amplifier (TA) that uses a pair of input signals having a predetermined time difference therebetween to repeatedly generate and output a pair of oscillation signals having the time difference. In the present example, the first oscillator unit 110 may comprise two oscillator blocks 110A and 110B. Specifically, the oscillator blocks 110A and 110B may be used to repeatedly generate a time difference (phase difference) between the outputs therefrom. The oscillator blocks 110A and 110B may have the same configuration and thus output signals having frequencies that are substantially equal to each other. The phrase "substantially equal" used herein means that a nominal error may be included. Although it is assumed that the signals ideally have no difference in frequency, a slight difference in frequency due, for example, to manufacture variation may not pose a practical problem.

Each of the oscillator blocks 110A and 110B may include, for example, a flip-flop circuit 111, a ring oscillator 112, a frequency divider 113, and a counter 114, as shown in FIG. 1.

A fixed-value ("H", for example) signal may be inputted to a data input terminal D of the flip-flop circuit 111 in the oscillator block 110A. Therefore, upon reception of a first clock signal START, the flip-flop circuit 111 may hold the value at the data input terminal D, for example, at the timing of the rising edge of the first clock signal START and output the value through a data output terminal Q. The same holds true for the flip-flop circuit 111 in the oscillator block 110B. That is, upon reception of a second clock signal STOP, the flip-flop circuit 111 may hold the value at the data input terminal D at the timing of the rising edge of the second clock signal STOP and output the value through the data output terminal Q. Further, upon reception of a reset signal R from the counter 114, which will be described later, each of the flip-flop circuits 111 may transition to a reset state, where the oscillator block 110 may stop its oscillation operation. When the TDC 100 is used as part of an ADPLL circuit, the first clock signal START and the second clock signal STOP may correspond to a frequency division feedback signal DIV_CLK and a reference clock signal REF_CLK, respectively.

The ring oscillator 112 may be an oscillation circuit in which an odd number of delay elements (inverters) are connected to each other in a ring shape. Upon reception of the clock signal (e.g., DIV_CLK or REF_CLK) from the flip-flop circuit 111, the ring oscillator 112 may oscillate at a predetermined frequency and output a pulsed oscillation signal. The oscillation signal may be inputted to the frequency divider 113.

The frequency divider 113 may be a circuit that divides the frequency of the inputted oscillation signal based on a predetermined division ratio so that the divided frequency matches or substantially matches the frequency of a signal used by the TDC 100. The divided oscillation signals (e.g., $OSC\_CLK_A$ and $OSC\_CLK_B$) may be inputted to the phase detector 120. In the present example, the inputted oscillation signal may be divided by a factor of eight so that the frequency is lowered by a factor of eight. Providing the frequency divider 113 allows reduction in the number of stages in the ring oscillator 112, thereby preventing an increase in current consumption. The frequency divider 113 may be omitted, and the frequency of the oscillation signal itself from the ring oscillator 112 may be lowered.

The counter 114 may count the number of edges of the divided oscillation signal (e.g., $OSC\_CLK_A$ and $OSC\_CLK_B$) and output the reset signal R to the flip-flop circuit 111 when the count reaches a predetermined repetition number. In the present example, the counter 114 may be configured to output the reset signal R when the count reaches four. The oscillator blocks 110A and 110B may, thus, generate four pulses per drive operation in response to the DIV_CLK signal and the REF_CLK signal as the clock signals.

The phase detector 120 may detect a phase difference between the oscillation signals (e.g., divided oscillation signals $OSC\_CLK_A$ and $OSC\_CLK_B$) inputted from the oscillator blocks 110A and 110B and output a pulsed differential enable signal ENA_GRO (e.g., ENA and ENA_B) according to the phase difference. The phase detector 120 may compare time differences between the rising edges of inputted signals. The phase detector 120 may have a predetermined offset that allows the phase detector 120 to output a fixed enable signal even when the phase difference between the inputted signals is very small. The differential enable signal ENA_GRO outputted from the phase detector 120 may be inputted to the second oscillator unit 130.

Figure 2A:
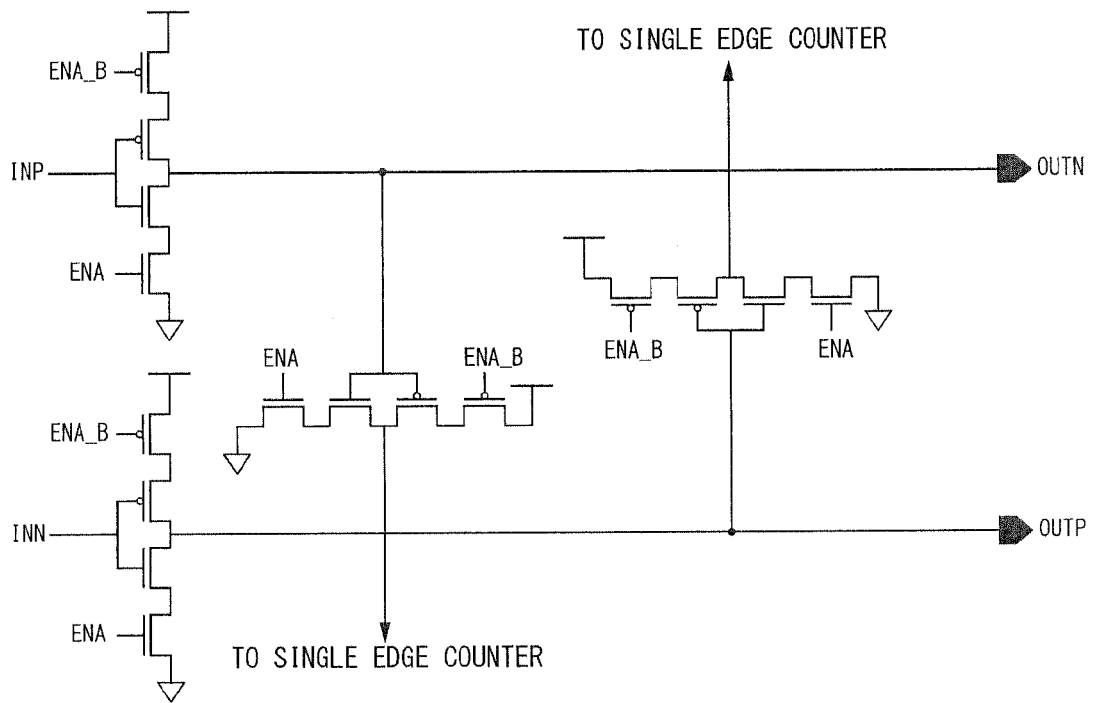
FIG. 2A shows an example of a configuration of a differential inverter that forms a second oscillator unit in a TDC according to one or more embodiments of the present invention.
Figure 2B:
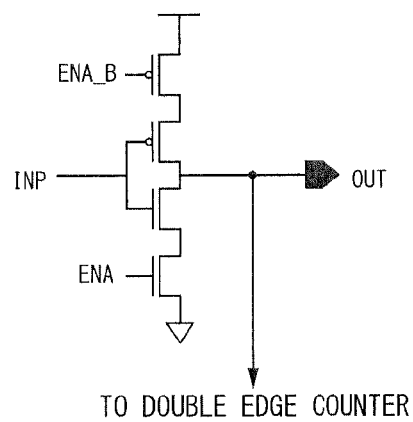
FIG. 2B shows an example of a configuration of a single-end inverter that forms a second oscillator unit in a TDC according to one or more embodiments of the present invention.
Figure 3A:
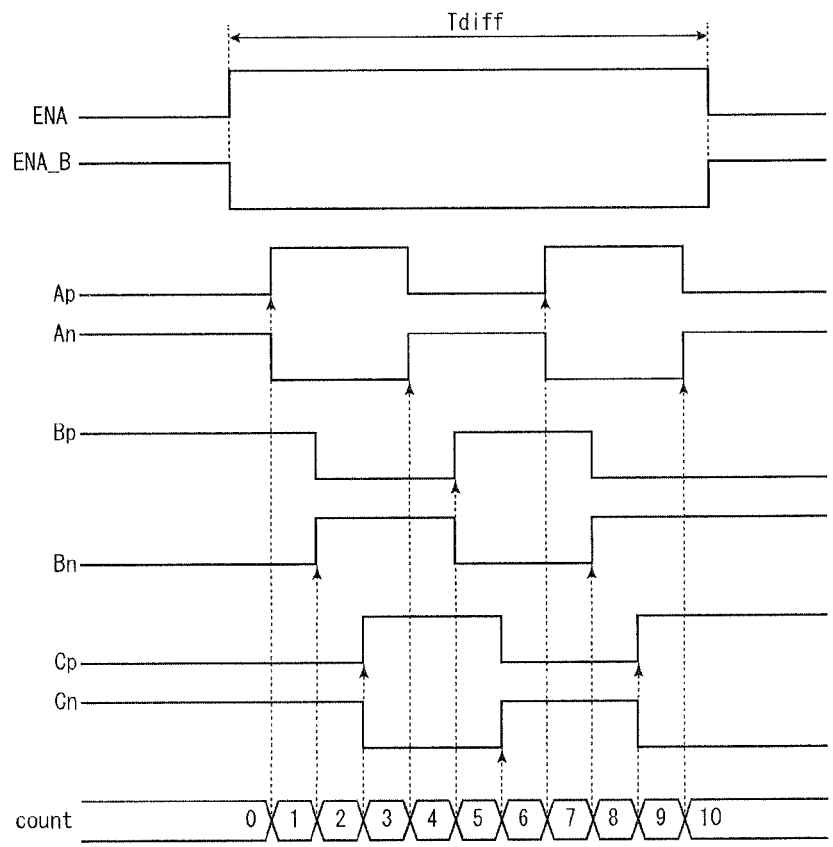
FIG. 3A is a timing chart for showing operation of a second oscillator unit using differential inverters in a TDC according to one or more embodiments of the present invention.
Figure 3B:
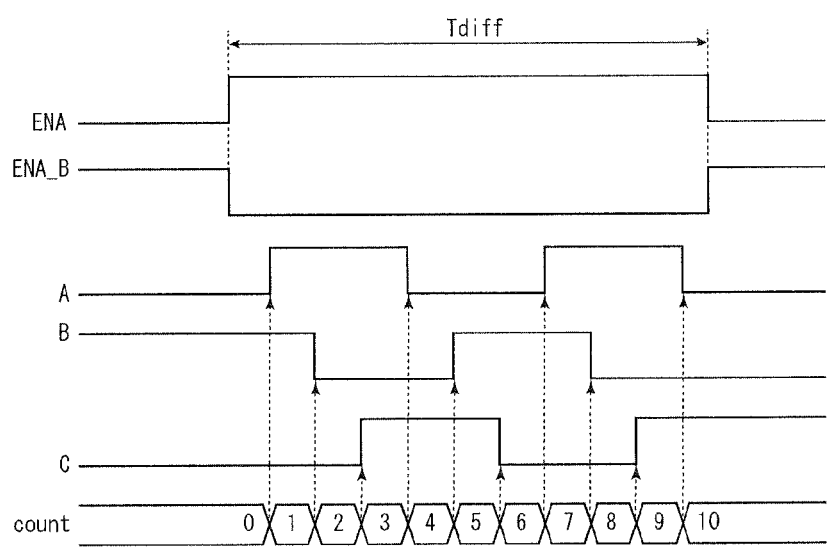
FIG. 3B is a timing chart for showing operation of a second oscillator unit using the single-end inverters in a TDC according to one or more embodiments of the present invention.

The second oscillator unit 130 may be an oscillation circuit configured as a gated ring oscillator (GRO). The second oscillator unit 130 may be configured so that differential inverters are connected to each other in a ring shape and operate in accordance with the enable signal inputted from the phase detector 120. In the present example, the second oscillator unit 130 may be configured, for example, by seven differential inverters, and a gate circuit in each of the differential inverters may be configured, for example, by a MOS transistor (only three (A to C) differential inverters are shown in FIG. 1 for ease of illustration). Each of the differential inverters (e.g., the portion enclosed by line II in FIG. 1) may be configured, for example, as shown in FIG. 2A. FIG. 3A is a timing chart for describing the operation of the second oscillator unit using the configured differential inverters (FIG. 3A shows a timing chart corresponding to the three differential inverters A to C for simplification of illustration). An edge of an output signal from each of the differential inverters may be counted by a single edge counter. FIG. 3A shows, by way of example, that the gated ring oscillator oscillates during an enable period Tdiff of ENA and ENA_B and a count output of 10 is obtained as a result of counting the number of edge transitions from L to H. In this example, the second oscillator unit 130 is configured by the differential inverters, but the invention is not limited to this. The second oscillator unit 130 may be configured by single-end inverters, as shown in FIG. 2B. FIG. 3B is a timing chart for showing the operation of the second oscillator unit using three single-end inverters as shown in FIG. 2B (FIG. 3B shows a timing chart corresponding to three single-end inverters for ease of illustration). An edge of an output signal from each of the single-end inverters may be counted by a dual edge counter. FIG. 3B shows, by way of example, that the gated ring oscillator oscillates during the enable period $T_{diff}$ of ENA and ENA_B and a count output of 10 that results from counting both the number of edge transitions from L to H and the number of edge transitions from H to L.

Assuming that the second oscillator unit 130 is a gated ring oscillator formed of the differential inverters shown in FIG. 2A, the operation of the second oscillator unit 130 will be described with reference to the corresponding timing chart shown in FIG. 3A.

The second oscillator unit 130 may oscillate only in the period during which the differential enable signals ENA and ENA_B are enabled, and thus the counter 140 may output a count in accordance with the enabled period. At the end of the enabled state of the differential enable signals ENA and ENA_B, the second oscillator unit 130 may hold the state at the end point (intermediate state). When the states of the differential enable signals ENA and ENA_B transition to the enabled state again, the second oscillator unit 130 may resume its operation from the intermediate state. In this case, the counter 140 may perform what is called a round-down quantization, and a quantization error is therefore carried over in the form of the intermediate state to the next enabled state. The quantization error therefore always appears in the foil of a difference between the quantization error carried over from the previous oscillation operation and a quantization error produced in the following oscillation operation. That is, the difference in quantization error may be a differentiation of a quantization error, and a noise shaping characteristic may be achieved because the differentiation of the quantization error shows a highpass filter characteristic.

Further, since the second oscillator unit 130 may start oscillation from an arbitrary intermediate state once the differential enable signals ENA and ENA_B transition to the enabled state, any differential inverters may be involved in the count operation performed by the counter 140, so that no specific differential inverter is exclusively involved in the count operation. Therefore, although differences in characteristics of the differential inverters based, for example, on manufacture errors are contained in the delays of the differential inverters, the differences may be statistically averaged to achieve linear oscillator characteristics. Further, since a small number of differential inverters form the ring configuration, the amount of integral nonlinearity error (INL error) can be reduced, thereby ensuring excellent linearity.

The same advantageous effect described above holds true for a case where the gated ring oscillator that serves as the second oscillator unit 130 is configured by the single-end inverters shown in FIG. 2B.

Referring again to FIG. 1, the counter 140 may be a quantization circuit that determines a quantized value based on a signal outputted from each of the differential inverters. Specifically, the counter 140 may be a single edge counter that detects and counts, for example, a rising edge of a signal outputted from each of the differential inverters as described above. In the present example, the counter 140 may be configured, for example, by 14 (7×2) counter circuits. The counts outputted from the counter circuits in the counter 140 may be summed by the adder 150. The summed count may be subsequently held by the register 160. The count held by the register 160 may also be outputted via a flip-flop circuit (not shown) to the divider 170. Although the detailed specification describes the counter 140, the adder 150, and the register 160 as separate components, they may well be combined with one another to form a single functional block (a quantization unit, for example). When each of the inverters that form the second oscillator unit 130 is a single-end inverter, the counter 140 may be implemented in the form of a dual edge counter, as described above.

The divider 170 may divide the count outputted from the register 160 by the number of repetitions described above and output a result of the division in the form of a digital code value TDC_OUT. In the present example, since the number of repetitions described above is four, the divider divides the count by four.

Figure 4:
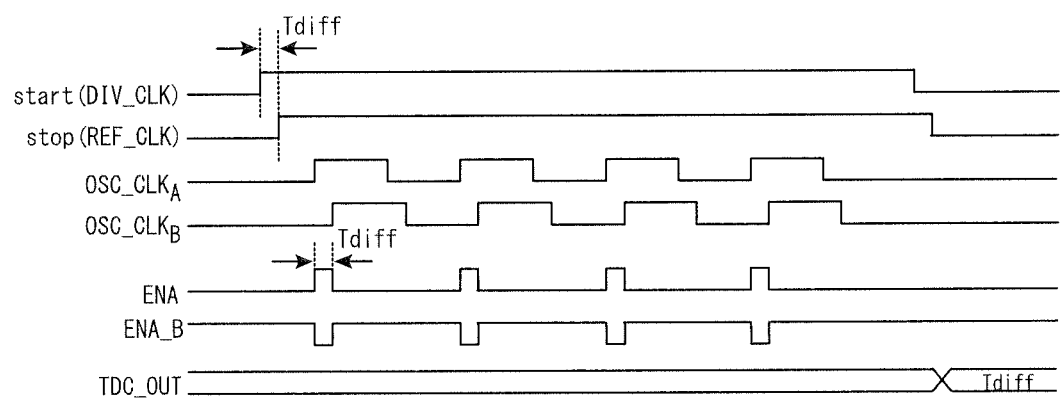
FIG. 4 is a timing chart of a variety of signals in a TDC according to one or more embodiments of the present invention.

The operation of the TDC 100 as configured and described above will now be described with reference to FIG. 4. FIG. 4 is a timing chart of a variety of signals in the TDC according to one or more embodiments of the invention.

In the TDC 100, the two oscillator blocks 110A and 110B may first use the clock signals DIV_CLK and REF_CLK having a phase difference Tdiff to repeatedly generate the pulsed oscillation signals $OSC\_CLK_A$ and $OSC\_CLK_B$ over the number of repetitions described above (e.g., four in the present example) and output the generated oscillation signals to the phase detector 120.

The phase detector 120 may generate the differential enable signals ENA and ENA_B in accordance with a phase difference between the oscillation signals $OSC\_CLK_A$ and $OSC\_CLK_B$ and output the generated differential enable signals to the second oscillator unit 130. The second oscillator unit 130 may oscillate in response to the differential enable signals ENA and ENA_B, and edges in the oscillation may be counted by the counter 140 in accordance with the operation shown in FIG. 3A when the second oscillator unit 130 is configured by differential inverters or in accordance with the operation shown in FIG. 3B when the second oscillator unit 130 is configured by single-end inverters. The count counted by the counter 140 may be accumulated in the register 160 over the number of repetitions. After four enabled signals are generated, and when a latch circuit (not shown) operates at a predetermined timing, the count held by the register 160 may be outputted to the divider 170 and divided by the number of repetitions, e.g., four. A result of the division may then be outputted in the form of the digital code value TDC_OUT.

According to the configured TDC 100, in which the two oscillator blocks 110A and 110B oscillate at the same or substantially the same frequency, a transfer function of the TDC 100 may be expressed as follows:

$$TDC\_OUT[z] = T\text{diff} + q_n/4 \cdot (1-z^{-1}) \quad \text{(Expression 1)}$$

where Tdiff represents the input time difference, and $q_n$ represents quantization noise produced in the second ring oscillator 130.

As is apparent from the expression described above, the quantization noise $q_n$ is divided by the number of repetitions and reduced by a factor of four. Therefore, even when the gate delay value in the second ring oscillator 130 is, for example, 50 [ps], an effective gate delay value is reduced to 12.5 [ps]. Further, in Expression 1, the coefficient $(1-z^{-1})$ represents the differentiation characteristic described above, e.g., the highpass filter characteristic and therefore provides a noise shaping effect.

Figure 5:
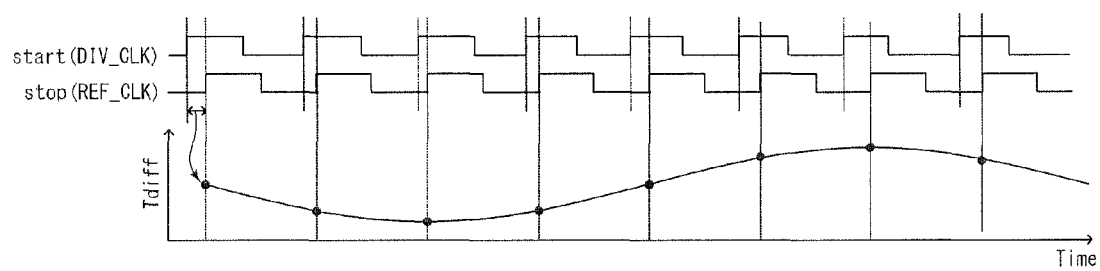
FIG. 5 is a timing chart of an input signal waveform used in a numerical calculation simulation performed on a TDC according to one or more embodiments of the present invention.

The inventor performed numerical calculation simulations to examine the effective resolution in consideration of the noise shaping. One of the simulations was performed on the TDC 100 according to the present example in a case where the gate delay value in the second oscillator unit 130 was 50 [ps], and the other simulation was performed on a TDC of related art with no noise shaping function in a case where the resolution was 2 [ps]. The circuit characteristics of the two TDCs were examined using "MATLAB/SIMULINK" provided from MathWorks, Inc. to perform the numerical calculation simulations and then performing Fourier transformation on the results of the simulations. Input waveforms to the TDCs were the two clock signals having the phase difference Tdiff therebetween corresponding to the amplitude according to a sinusoidal waveform having a frequency of 200 [kHz] and a maximum amplitude of 200 [ps], as shown in FIG. 5. The sampling frequency (e.g., frequency of REF_CLK) was 30 [MHz].

Figure 6:
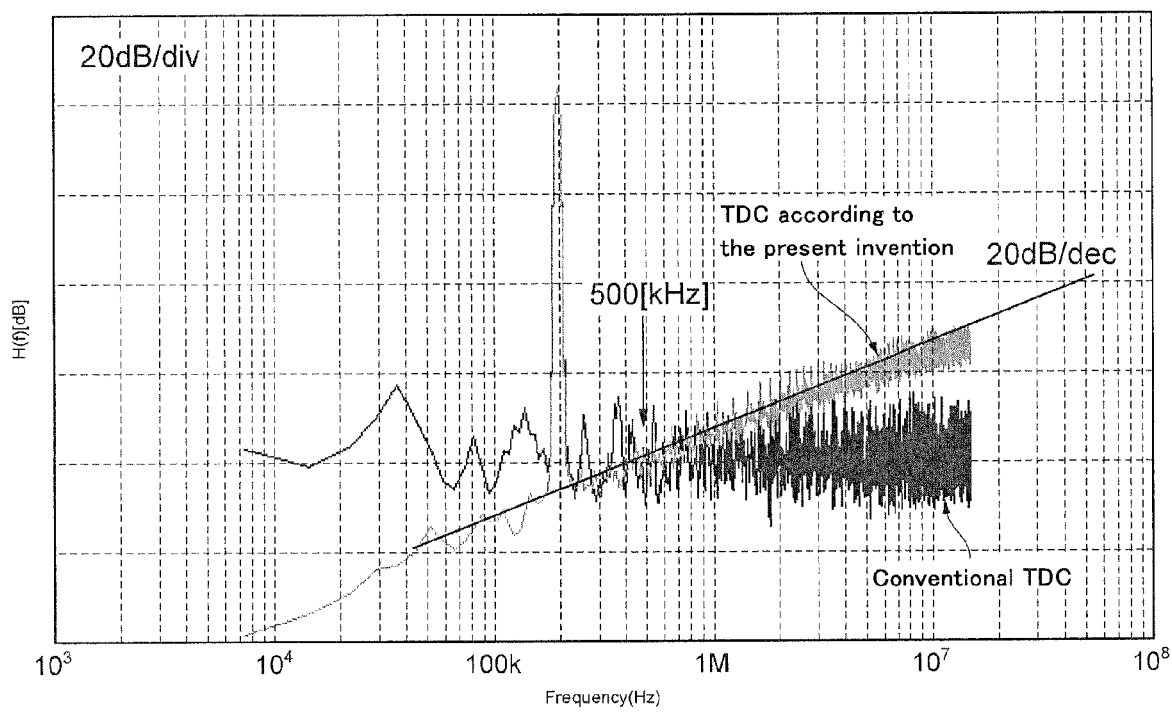
FIG. 6 shows a result of numerical calculation simulations performed on a TDC according to one or more embodiments of the present invention and a conventional TDC.

FIG. 6 shows a result of the numerical calculation simulations described above. In FIG. 6, the graph line drawn in pale gray represents a result of the numerical simulation performed on the TDC 100 according to the present example, and the graph line drawn in black represents a result of the numerical simulation performed on the conventional TDC. As shown in FIG. 6, in the TDC 100 according to the present example, a noise shaping effect reduces the quantization noise by about 20 dB/dec. A comparison between the results of the two TDCs shows that the amount of quantization noise from the TDC according to the present example is smaller than that from the conventional TDC over the frequencies less than or equal to about 500 [kHz]. Therefore, for example, when the loop bandwidth of an ADPLL circuit using the TDC 100 according to the present example is narrower than or equal to 500 [kHz], the effective resolution of 2 [ps], which is the resolution of the conventional TDC used in the numerical calculation simulations, or smaller can be achieved.

Further, the following two types of non-ideal conditions resulting from "variation" in a chip on which the TDC 100 is mounted should be taken into consideration:

(1) Offset setting in the phase detector 120 and difference in cycle between the two oscillator blocks 110A and 110B (2) Variation in gate delay value in the second oscillator unit 130

Figure 7:
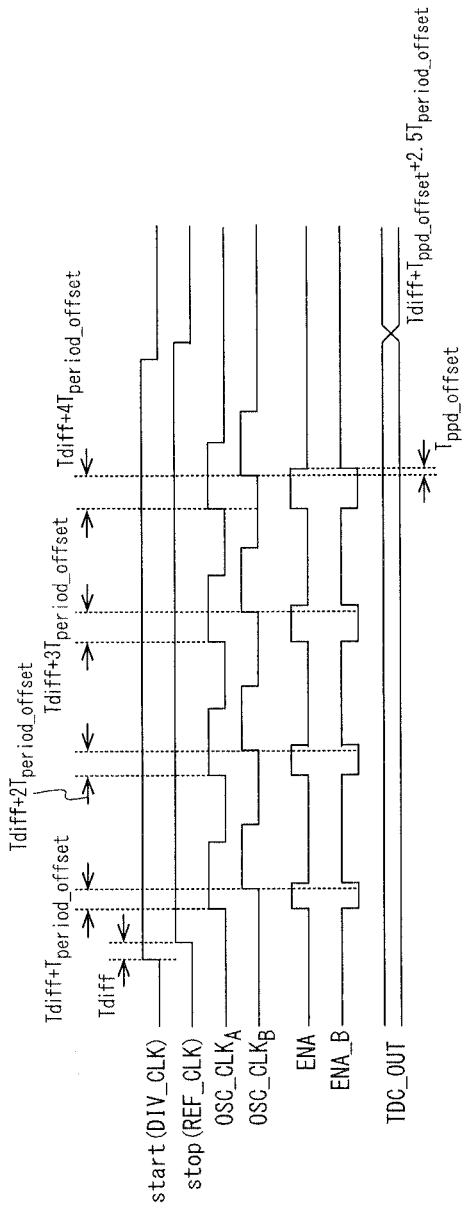
FIG. 7 is a timing chart of a variety of signals in consideration of a non-ideal condition in a TDC according to one or more embodiments of the present invention.

With respect to (1), the non-ideal condition is believed to affect an output from the TDC 100, as shown in the timing chart shown in FIG. 7 and the following transfer function.

$$\text{TDC\_OUT}[z] = T\text{diff} + T_{pfd\_offset} + 2.5 T_{period\_offset} + q_n / 4 \cdot (1 - z^{-1}) \quad \text{(Expression 2)}$$

where $T_{pfd\_offset}$ represents an offset produced in the phase detector 120, and $T_{period\_offset}$ represents a difference in cycle between the two oscillator blocks 110A and 110B. The offset $T_{pfd\_offset}$ produced in the phase detector 120 may be directly added to the output TDC_OUT, whereas a difference in cycle $T_{period\_offset}$ between the oscillator blocks 110A and 110B may appear after each output from the ring oscillator 112. As shown in FIG. 7, once each of the four repetitions occurs, $T_{period\_offset}$, $2T_{period\_offset}$, $3T_{period\_offset}$, or $4T_{period\_offset}$ may be added, and all the differences may be summed in the quantization process, so that the summed value may contain a total of $10T_{period\_offset}$. Since the summed value may be divided by the number of repetitions in the divider 170 and hence reduced by a factor of 4, the resultant TDC_OUT may contain $2.5T_{period\_offset}$. That is, the offset produced by the phase detector 120 and the cycle difference of $10T_{period\_offset}/4$ may eventually be added to the digital code value TDC_OUT.

However, since the effect of the non-ideal condition (1) on the digital code value TDC_OUT is fixed regardless of the input time difference, the non-ideal condition (1) may not affect the locking operation of the ADPLL circuit using the TDC 100. Therefore, in the TDC 100 according to the present example, variations in some degree in the oscillator blocks 110A and 110B may not need to be considered, and manual wiring using a standard cell (as well as layout design based on P&R Tool) can be employed, whereby the layout design can be readily performed.

Further, "MATLAB/SIMULINK" was used to examine the non-ideal condition (2). A TDC using single delay lines of related art (SDL-TDC) was used as a TDC for comparison. Firstly, the gate delay value and the standard deviation thereof in the TDC 100 according to the present example and the SDL-TDC of related art are shown below.

TDC 100 according to the present example
    Gate delay value of GRO 130: 50 [ps]
    Standard deviation of gate delay value: 10 [ps]
    Number of repetitions: four
SDL-TDC
    Gate delay value: 12.5 [ps]
    Standard deviation of gate delay value: 2.5 [ps]

Figure 8A:
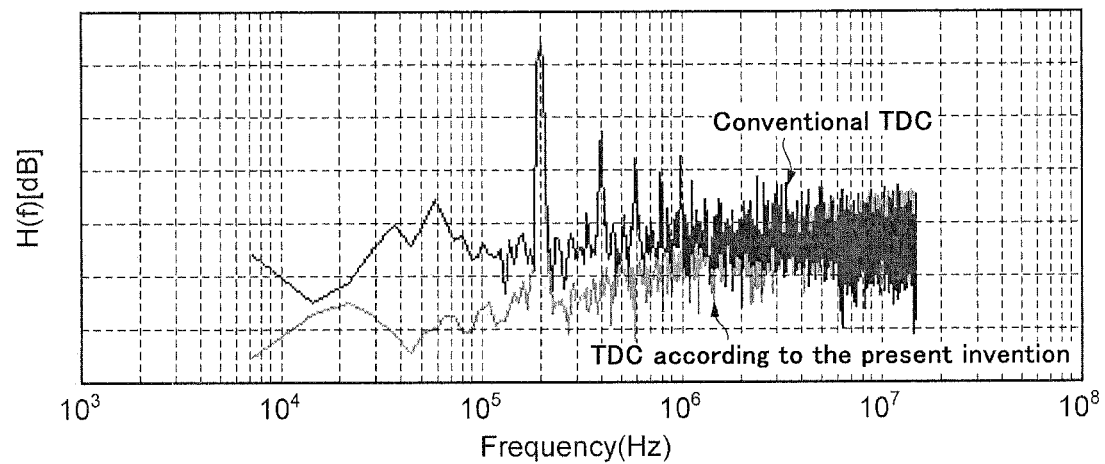
FIGS. 8A and 8B show results of numerical calculation simulations performed on a TDC according to one or more embodiments of the present invention.
Figure 8B:
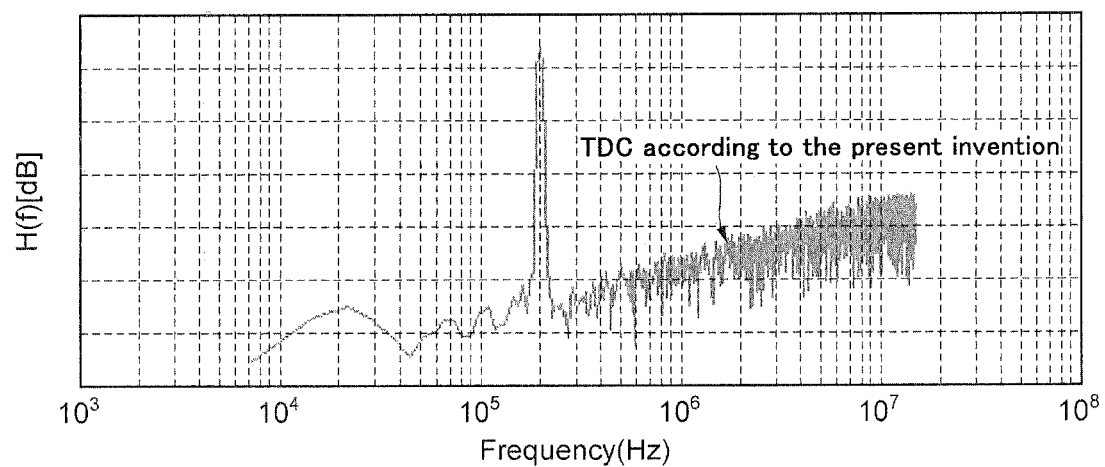

FIGS. 8A and 8B show results of the numerical calculation simulations performed on the TDC according to the present example. Input phase difference to the TDC 100 according to the present example and the SDL-TDC is the same as that described in FIG. 5. FIG. 8A shows results obtained by performing Fourier transformation on outputs from the two TDCs with the results superimposed on each other, and FIG. 8B shows only the result obtained by performing Fourier transformation on the output from the TDC according to the present example. In FIG. 8A, the graph line drawn in black represents a result of the numerical simulation performed on the SDL-TDC of related art. As seen from the graph line, in the SDL-TDC, spurious peaks due to nonlinearity are present, whereas in the TDC 100 according to the present example drawn in pale gray, no spurious peak is seen. Accordingly, even when the second oscillator unit 130 shows variations in gate delay, linearity can be maintained and performance degradation can be minimized.

As described above, according to the present example, the second oscillator unit formed of a gated ring oscillator (GRO) may improve the effective resolution based on the noise shaping. Further, the GRO is not necessarily a multipath GRO, whereby the layout design can be readily performed with the linearity improved.

The use of a non-multipath GRO inevitably increases the gate delay value. However, because two clock signals having a slight time difference therebetween are repeatedly reproduced over a predetermined number of times, the input time difference is amplified and, therefore, the effective gate delay value is reduced.

SECOND EXAMPLE

In the First Example described above, the case where the two oscillator blocks repeatedly reproduce oscillation signals having a predetermined number of time difference therebetween (four, for example) has been disclosed. On the other hand, in the present example, a case where the repetitive reproduction is performed at variable times is disclosed. That is, in general, an ADPLL circuit cannot control the phase relationship between the two clock signals DIV_CLK and REF_CLK before the oscillation circuit oscillates and makes the PLL loop active. An ADPLL circuit may start tracking based on feedback even when, for example, a shift of about 0.5 clock width is present. If the ADPLL circuit operates in this state and performs repetitive reproduction for a predetermined number of times, the repetitive reproduction cannot be performed specified times in a single clock, which could result in incorrect operation. As a result, the tracking is likely to remain non-convergent. To avoid this situation and ensure correct operation of the ADPLL circuit, a TDC according to the present example may be configured so that oscillation signals having a time difference therebetween are repeatedly reproduced for a changeable number of times.

(1) First Configuration Example for the Second Example

Figure 9:
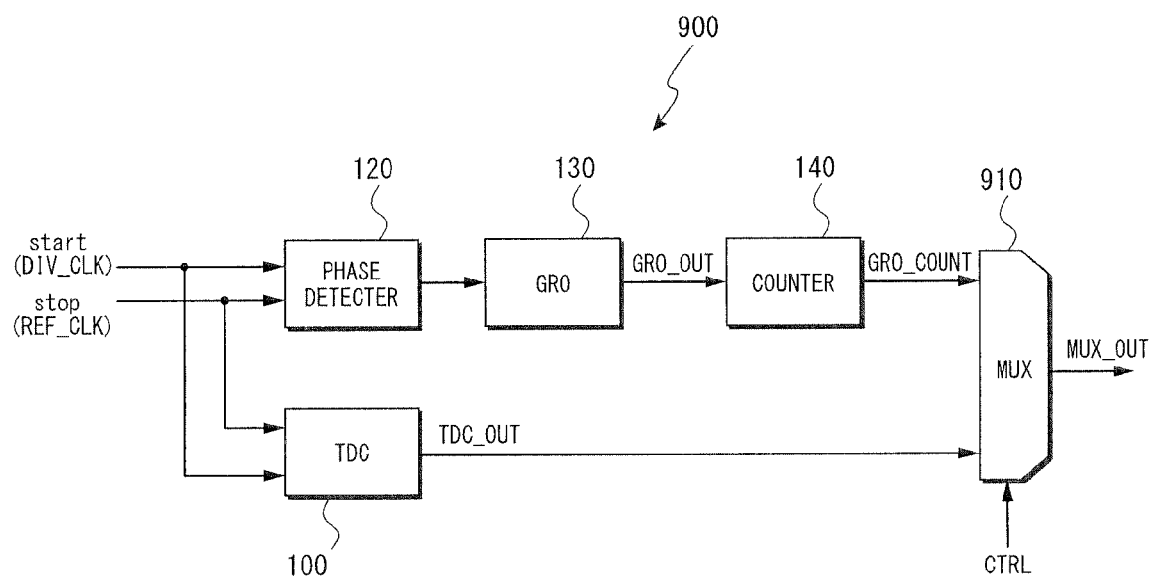
FIG. 9 is a block diagram showing an example of a configuration of a TDC according to one or more embodiments of the present invention.

FIG. 9 is a block diagram showing a configuration example of a TDC according to the present example. That is, a TDC 900 in the present example may include at least one TDC 100 as described above, a phase detector 120 and a gated ring oscillator (GRO) 130 of related art, a counter 140, and a multiplexer 910, as shown in FIG. 9. The TDC 100 is a module in the entire TDC 900. The GRO 130 may be configured, for example, by, but not limited to, differential inverters, such as those described above.

More specifically, the TDC 900 may be configured so that a control signal CTRL outputted from a controller (not shown) is configured to control the multiplexer 910 in selectively switching an output from the counter 140 to an output from the TDC 100 or vice versa. For example, the TDC 900 may select an output from the GRO 130 until a predetermined time period elapses after the TDC starts operating, whereas selecting an output from the TDC 100 after the predetermined time period elapses under the control of the controller. Alternatively, the TDC 900 may control the multiplexer 910 to switch one of the outputs to the other in accordance with the value of an eventually outputted digital code value MUX_OUT. For example, among a series of digital code values MUX_OUT outputted in accordance with the cycle of the reference clock signal REF_CLK after the TDC 900 starts operating, the controller may evaluate whether the difference between a maximum and a minimum of the digital code values MUX_OUT falls within a predetermined range, and when the evaluation shows that the difference does fall within the predetermined range, the controller may control the multiplexer 910 to select the output from the TDC 100.

In the present example, the TDC 900 is configured by the single TDC 100, but the invention is not limited thereto. For example, in addition to or in place of the phase detector 120/GRO 130, the TDC 900 may be configured by a plurality of TDCs 100 that perform repetitive reproduction of different number of times. For example, although not shown, TDCs 100A to 100C may be set to perform repetitive reproduction once, twice, and four times respectively, and the TDC 900 may be configured to select an output sequentially from the TDCs 100A to 100C. Contrary to the configurations of the Second Example, the First Example fixes the number of repetitive reproduction at, for example, four times.

(2) Second Configuration Example for the Second Example

Figure 10:
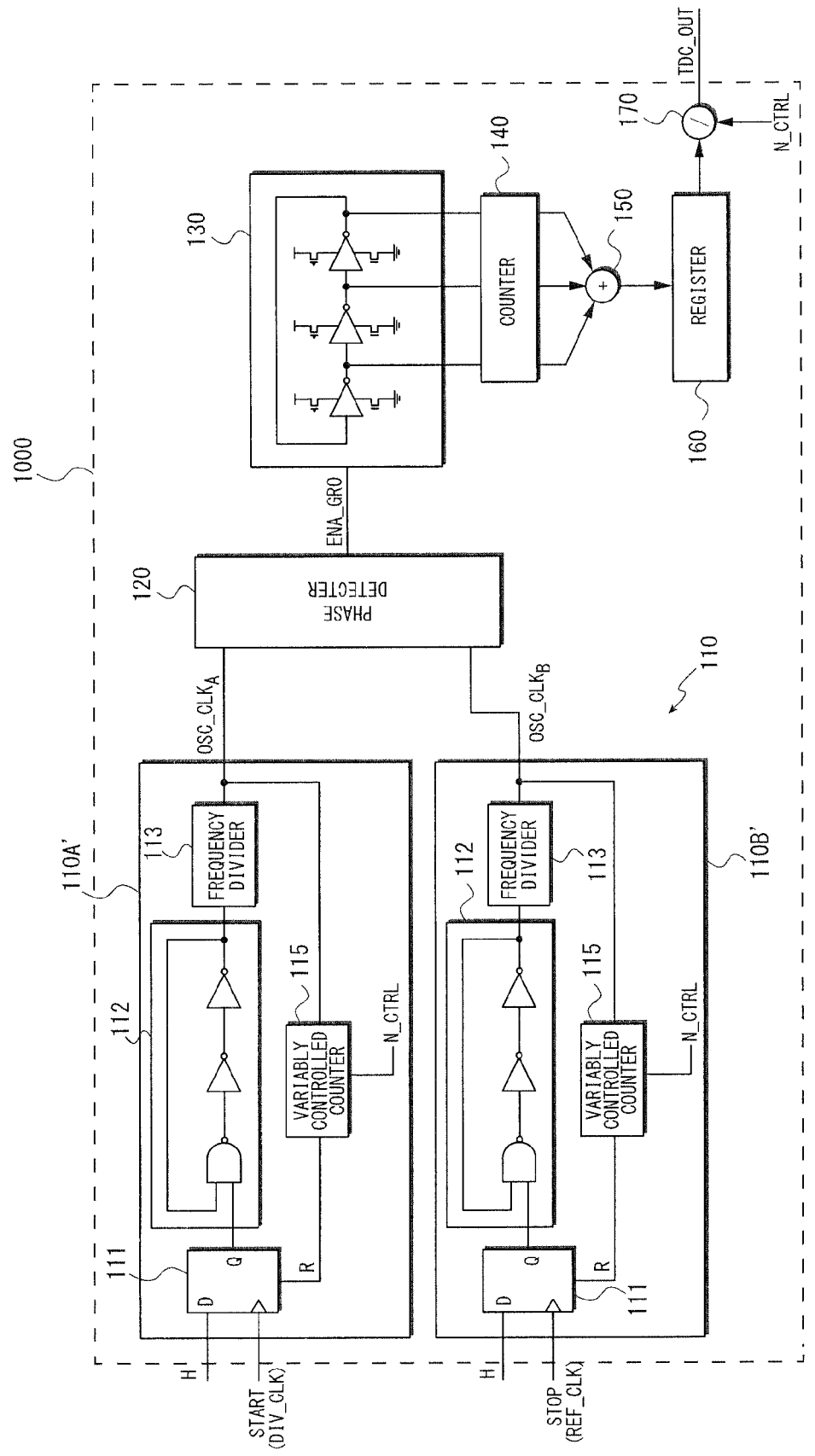
FIG. 10 is a block diagram showing an example of a configuration of a TDC according to one or more embodiments of the present invention.

FIG. 10 is a block diagram showing a configuration example of a TDC according to the present example. That is, a TDC 1000 shown in FIG. 10 differs from the TDC 100 shown in FIG. 1 in that the counter circuit 114 is replaced with a variably controlled counter 115. The variably controlled counter 115 may dynamically change the output timing of the reset signal R in accordance with a control signal N_CTRL from a controller (not shown). The TDC 1000 may, for example, set N_CTRL=1 when the TDC 1000 starts operating so that the variably controlled counter 115 outputs the reset signal R after the reproduction is performed once, and the TDC 1000 may further sequentially change the value of N_CTRL after a predetermined time period elapses and/or in accordance with the value of the digital code value TDC_OUT. Further, the timing at which an output from the register 160 is provided and the value provided to the divider 170 (divisor) may also be changed simultaneously with the control signal N_CTRL.

THIRD EXAMPLE

Figure 11:
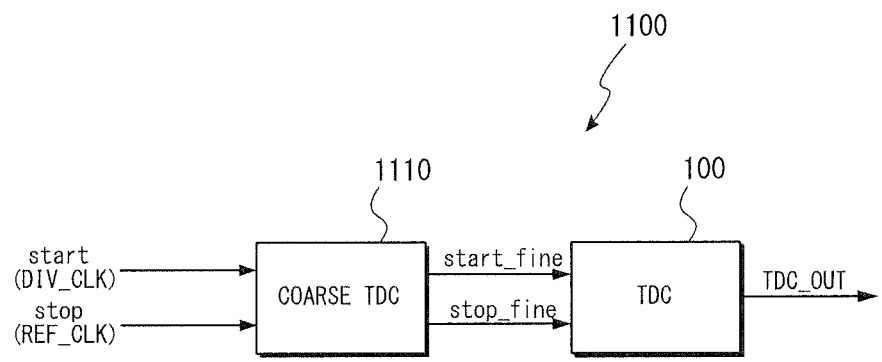
FIG. 11 is a block diagram showing an example of a configuration of a TDC according to one or more embodiments of the present invention.

The present example discloses a TDC constituent that applies a coarse/fine two-step configuration. FIG. 11 is a block diagram showing a TDC configuration according to the present example. That is, a TDC 1100 according to the present example may include a coarse TDC 1110 provided in a position upstream of the TDC 100 described above, as shown in FIG. 11.

The coarse TDC 1110 may be designed so that its input range is wider than or equal to the input range of the TDC 100 and may be a TDC having relatively low resolution. This means that the coarse TDC 1110 can prevent an increase in current consumption. The coarse TDC 1110 can be an existing one and, thus, description thereof is omitted for brevity. According to the present example, the wide input range of the coarse TDC 1110 may allow reception of a large phase difference between DIV_CLK and REF_CLK, and the low resolution of the coarse TDC 1110 may be improved by inputting quantization residues start_fine and stop_fine to the TDC 100 before quantization, whereby high resolution with a small amount of error is provided.

In the TDC 1100 according to the present example, the TDC 100 may be replaced, for example, with the TDC 900 or the TDC 1000 shown in the Second Example.

The TDC 1100 having the two-step configuration can ensure correct operation of an ADPLL circuit and enlarge the range of the input time difference in the entire TDC.

Figure 12:
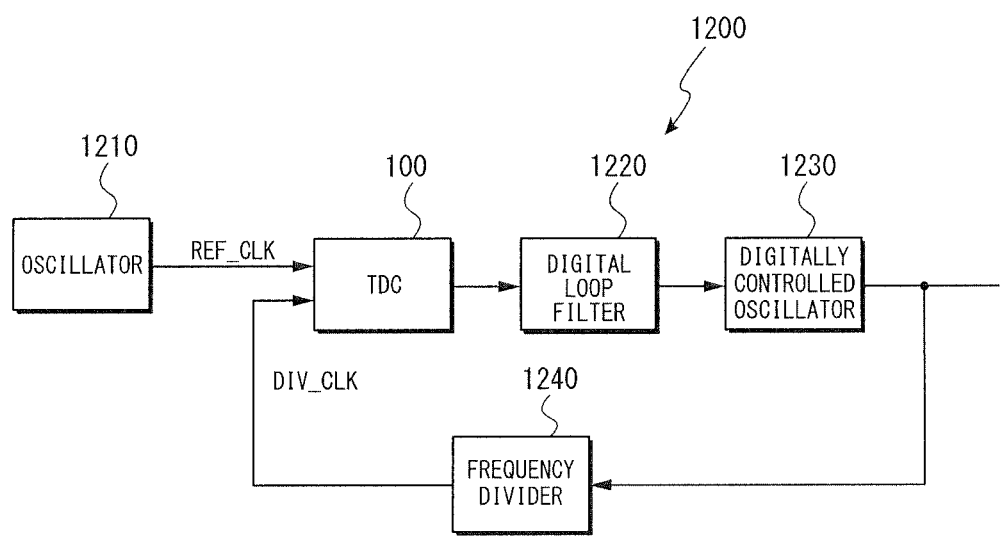
FIG. 12 is a block diagram showing a schematic configuration of an ADPLL circuit using a TDC according to one or more embodiments of the present invention.

Any of the TDCs according to the First Example and the Second Example can be used to configure, for example, an ADPLL circuit. FIG. 12 is a block diagram showing a schematic configuration of an ADPLL circuit using a TDC according to the present example. Specifically, an ADPLL circuit 1200 may include, for example, an oscillator 1210, a TDC 100, a digital loop filter (DLF) 1220, a digitally controlled oscillator (DCO) 1230, and a frequency divider 1240, as shown in FIG. 12. Each of the oscillator 1210, the digital loop filter (DLF) 1220, the digitally controlled oscillator (DCO) 1230, and the frequency divider 1240 can be an existing one, and the description thereof will not be described for brevity. Further, in the present example, the time-to-digital converter is the TDC 100 according to the First Example, but the time-to-digital converter is not limited thereto and can be the TDC according to any of the other examples described above.

The examples described above have been presented to help describe the present invention. The examples, however, are not intended to limit the scope of the present invention. Further, various modifications and combinations may be carried out without departing from the spirit of the present invention.

For example, as disclosed in the present specification, the steps, operations, and functions may be carried out concurrently or in different orders as long as results cause no contradiction. The steps, operations, and functions described above have been presented only by way of example, and some of the steps, operations, and functions can be omitted or combined with each other into a single step, operation, or function, or other steps, operations, and functions may be added to the extent that the omission, combination, and addition do not depart from the substance of the present invention.

For example, although the divider 170 is used in the examples described above, the divider 170 is not necessary and may be replaced by a multiplier.

Further, in the present specification, in which a variety of examples have been disclosed, a specific feature (technical item) in an example can be improved as appropriate and the improved feature can be added to other examples or can replace specific features in the other examples. These aspects all fall within the scope of the present invention.

One or more embodiments of the invention relate to a time-to-digital converter that may include a first oscillator unit including a pair of ring oscillators to generate and output first oscillation signals based on a pair of predetermined clock signals having a predetermined phase difference therebetween, a phase detector that outputs, based on the first oscillation signals outputted from the pair of ring oscillators, an enable signal in accordance with a phase difference between the oscillation signals, a second oscillator unit that generates and outputs a second oscillation signal having a predetermined frequency in accordance with the enable signal outputted from the phase detector, a first counter that counts the number of edges of the second oscillation signal outputted from the second oscillator unit and holds the count, and a divider that divides the count held in the first counter by a predetermined coefficient to provide a quantized value and outputs the quantized value. Each of the pair of ring oscillators may generate, in a single cycle of the corresponding clock signal, the first oscillation signal formed of pulses repeated by a predetermined number equal to the predetermined coefficient.

The first oscillator unit may include frequency dividers, each of which divides the first signal outputted from the corresponding one of the pair of ring oscillators by a predetermined division ratio.

The first oscillator unit may include second counters, each of which counts the number of edges of the first oscillation signal and causes the corresponding ring oscillator to stop outputting the first oscillation signal when the count reaches the number equal to the predetermined coefficient. The second counter may be configured to change the predetermined number.

Further, the second oscillator unit may be a gated ring oscillator that oscillates in accordance with the enable signal. The gated ring oscillator may be configured by a plurality of differential inverters or single-end inverters.

One or more embodiments of the invention relate to a time-to-digital converter constituent that may include a plurality of time-to-digital converter modules, each of which is configured by the time-to-digital converter described above, and a multiplexer that selectively switches an output from any of the plurality of time-to-digital converter modules to another. The multiplexer may perform the switching control under a predetermined condition, such as after a predetermined time period elapses since the time-to-digital converter constituent begins operating, or as dictated by one of outputted code values.

One or more embodiments of the invention relate to a time-to-digital converter constituent which may include a first time-to-digital converter module configured by the time-to-digital converter described above, and a second time-to-digital converter module having an input phase difference range wider than the input phase difference range of the first time-to-digital converter module. The second time-to-digital converter module performs a first quantization based on a pair of inputted predetermined clock signals, and the first time-to-digital converter module performs a second quantization based on a quantization error produced by the first quantization.

One or more embodiments of the invention also relate to a PLL circuit which may include the time-to-digital converter described above, a digital loop filter that removes high-frequency noise components from a signal outputted from the time-to-digital converter, a digitally controlled oscillator that is controlled based on a signal outputted from the digital loop filter, and a frequency divider that divides a signal outputted from the digitally controlled oscillator by a predetermined demultiplication ratio and outputs the demultiplied signal as a feedback signal to the time-to-digital converter.

The present invention is widely applicable to a wide range of technologies, such as a clock generation circuit, a frequency synthesizer, and a clock and data recovery circuit.

What is claimed is:

1. A time-to-digital converter comprising:
   a first oscillator unit that generates and outputs a pair of first oscillation signals based on a pair of predetermined clock signals having a predetermined phase difference therebetween;
   a second oscillator unit that generates and outputs a second oscillation signal having a predetermined frequency based on the pair of first oscillation signals outputted from the first oscillator unit; and
   a quantizer that calculates a quantized value based on a number of edges of the second oscillation signal outputted from the second oscillator unit.

2. The time-to-digital converter according to claim 1, wherein
   the first oscillator unit comprises a pair of ring oscillators, and
   the pair of ring oscillators generates and outputs the pair of first oscillation signals based on the pair of predetermined clock signals.

3. The time-to-digital converter according to claim 2, wherein each of the pair of ring oscillators generates, in a cycle of the corresponding clock signal, the first oscillation signal having a predetermined number of edges corresponding to a predetermined coefficient.

4. The time-to-digital converter according to claim 1, further comprising a phase detector that outputs, based on the pair of first oscillation signals outputted from the first oscillator unit, a differential enable signal in accordance with the phase difference between the first oscillation signals, wherein the second oscillator unit generates and outputs the second oscillation signal in accordance with the differential enable signal outputted from the phase detector.

5. The time-to-digital converter according to claim 4, wherein the second oscillator unit comprises a gated ring oscillator that oscillates in accordance with the differential enable signal.

6. The time-to-digital converter according to claim 5, wherein the gated ring oscillator comprises a plurality of differential inverters that oscillate in accordance with the differential enable signal.

7. The time-to-digital converter according to claim 5, wherein the gated ring oscillator comprises a plurality of single-end inverters that oscillate in accordance with the differential enable signal.

8. The time-to-digital converter according to claim 3, wherein the quantizer comprises a divider that divides a calculated quantized value by the predetermined coefficient and outputs a code value that is a result of a division.

9. The time-to-digital converter according to claim 2, wherein the first oscillator unit comprises first frequency dividers, each of which divides the first signal outputted from the corresponding one of the pair of ring oscillators by a predetermined division ratio.

10. The time-to-digital converter according to claim 9, wherein the first frequency dividers variably change the predetermined division ratio.

11. The time-to-digital converter according to claim 3, wherein the first oscillator unit comprises counters, each of which counts a number of edges of the first oscillation signal and causes the corresponding ring oscillator to stop outputting the first oscillation signal when the count reaches the predetermined coefficient.

12. The time-to-digital converter according to claim 11, wherein each of the counters is capable of changing the predetermined number.

13. A time-to-digital converter unit comprising:
a plurality of time-to-digital converter modules, each of which is configured according to the time-to-digital converter claimed in claim 1; and
a multiplexer that selectively switches an output from any of the plurality of time-to-digital converter modules to another of the plurality of time-to-digital converter modules,
wherein the multiplexer performs the switching control either after a predetermined period elapses from a time when the time-to-digital converter begins operating or based on one of outputted code values.

14. A time-to-digital converter unit comprising:
a first time-to-digital converter module configured according to the time-to-digital converter claimed in claim 1; and
a second time-to-digital converter module having an input phase difference range wider than an input phase difference range of the first time-to-digital converter module,
wherein the second time-to-digital converter module performs a first quantization based on a pair of inputted predetermined clock signals, and
wherein the first time-to-digital converter module performs a second quantization based on a quantization error produced by the first quantization.

15. A PLL circuit comprising:
the time-to-digital converter according to claim 1;
a digital loop filter that removes high-frequency noise components from a signal outputted from the time-to-digital converter;
a digitally controlled oscillator that is controlled based on a signal outputted from the digital loop filter; and
a second frequency divider that divides a signal outputted from the digitally controlled oscillator by a predetermined division ratio and outputs the divided signal as a feedback signal to the time-to-digital converter.

16. A PLL circuit comprising:
the time-to-digital converter unit according to claim 13;
a digital loop filter that removes high-frequency noise components from a signal outputted from the time-to-digital converter unit;
a digitally controlled oscillator that is controlled based on a signal outputted from the digital loop filter; and
a second frequency divider that divides a signal outputted from the digitally controlled oscillator by a predetermined division ratio and outputs the divided signal as a feedback signal to the time-to-digital converter unit.

17. A PLL circuit comprising:
the time-to-digital converter unit according to claim 14;
a digital loop filter that removes high-frequency noise components from a signal outputted from the time-to-digital converter unit;
a digitally controlled oscillator that is controlled based on a signal outputted from the digital loop filter; and
a second frequency divider that divides a signal outputted from the digitally controlled oscillator by a predetermined division ratio and outputs the divided signal as a feedback signal to the time-to-digital converter unit.

* * * * *